(12) United States Patent
Dellinger

(10) Patent No.: US 8,504,950 B2
(45) Date of Patent: Aug. 6, 2013

(54) MODULAR ARRAY DEFINED BY STANDARD CELL LOGIC

(75) Inventor: Eric Dellinger, San Jose, CA (US)

(73) Assignee: Otrsotech, Limited Liability Company, Wilmington, DE (US)

( * ) Notice: Subject to any disclaimer, the term of this patent is extended or adjusted under 35 U.S.C. 154(b) by 115 days.

(21) Appl. No.: 12/842,670

(22) Filed: Jul. 23, 2010

(65) Prior Publication Data

US 2010/0299648 A1 Nov. 25, 2010

Related U.S. Application Data

(62) Division of application No. 10/447,465, filed on May 28, 2003, now Pat. No. 7,770,144.

(51) Int. Cl.
*G06F 17/50* (2006.01)
*G06F 7/38* (2006.01)
*H01L 25/00* (2006.01)

(52) U.S. Cl.
USPC ............... 716/54; 716/51; 716/119; 716/132; 716/138; 326/37; 326/38; 326/39; 326/40; 326/41

(58) Field of Classification Search
USPC ............... 716/51, 54, 119, 132, 138; 326/37, 326/38, 39, 40, 41
See application file for complete search history.

(56) References Cited

U.S. PATENT DOCUMENTS

| | | |
|---|---|---|
| 4,613,940 A | 9/1986 | Shenton et al. |
| 4,935,734 A | 6/1990 | Austin |
| 5,523,611 A | 6/1996 | Mischel et al. |
| 5,536,955 A | 7/1996 | Ali |
| 5,638,380 A | 6/1997 | De |
| 5,696,693 A | 12/1997 | Aubel et al. |
| 5,702,868 A | 12/1997 | Kellam et al. |
| 5,889,329 A | 3/1999 | Rostoker et al. |
| 6,014,038 A | 1/2000 | How et al. |
| 6,242,767 B1 | 6/2001 | How et al. |
| 6,331,790 B1 | 12/2001 | Or-Bach et al. |
| 6,445,065 B1 | 9/2002 | Gheewala et al. |
| 6,457,164 B1 | 9/2002 | Hwang et al. |
| 6,536,028 B1 | 3/2003 | Katsioulas et al. |
| 6,611,932 B2 * | 8/2003 | How et al. ..................... 714/724 |
| 6,613,611 B1 | 9/2003 | How et al. |
| 6,617,621 B1 | 9/2003 | Gheewala et al. |

(Continued)

FOREIGN PATENT DOCUMENTS

| | | |
|---|---|---|
| JP | 02-202717 | 8/1990 |
| JP | 09-092724 | 4/1997 |

(Continued)

OTHER PUBLICATIONS

Final Rejection issued Aug. 19, 2011 from JP Patent Application No. 2006-533453.

(Continued)

*Primary Examiner* — Helen Rossoshek

(74) *Attorney, Agent, or Firm* — Schwabe, Williamson & Wyatt, P.C.

(57) ABSTRACT

Disclosed herein is an ASIC having a base array of function blocks. Each function block includes a plurality of primitive cells. Each primitive cell is defined by a component from a standard cell library. The base array is prefabricated for use later with a custom circuit design.

12 Claims, 10 Drawing Sheets

U.S. PATENT DOCUMENTS

| | | | |
|---|---|---|---|
| 6,642,744 | B2 | 11/2003 | Or-Bach et al. |
| 6,690,194 | B1 | 2/2004 | How et al. |
| 6,694,491 | B1 | 2/2004 | Osann, Jr. et al. |
| 6,696,856 | B1 * | 2/2004 | Smith et al. ............. 326/39 |
| 6,756,811 | B2 | 6/2004 | Or-Bach |
| 6,769,109 | B2 | 7/2004 | Osann, Jr. et al. |
| 6,770,949 | B1 | 8/2004 | Eltoukhy |
| 6,819,136 | B2 | 11/2004 | Or-Bach |
| 6,861,867 | B2 * | 3/2005 | West et al. ............. 326/38 |
| 6,885,043 | B2 | 4/2005 | Smith et al. |
| 7,102,237 | B1 | 9/2006 | Dellinger |
| 7,648,912 | B1 | 1/2010 | Dellinger |
| 2001/0038297 | A1 | 11/2001 | Or-Bach |
| 2002/0010903 | A1 | 1/2002 | Osann, Jr. et al. |
| 2002/0043988 | A1 | 4/2002 | Or-Bach et al. |
| 2002/0053063 | A1 | 5/2002 | Bhattacharya et al. |
| 2003/0155587 | A1 | 8/2003 | Smith et al. |
| 2003/0206036 | A1 | 11/2003 | Or-Bach |
| 2004/0049759 | A1 | 3/2004 | Osann, Jr. et al. |
| 2004/0201098 | A1 | 10/2004 | Corrigan |
| 2005/0012520 | A1 | 1/2005 | Or-Bach |
| 2005/0024086 | A1 | 2/2005 | Or-Bach |

FOREIGN PATENT DOCUMENTS

| | | |
|---|---|---|
| JP | 2001-326281 | 11/2001 |
| JP | 2003-007827 | 1/2003 |
| WO | 9502903 A1 | 1/1995 |

OTHER PUBLICATIONS

Helie, Les Asic modulaires comblent l'espace entre Asic et FPGA, Electronique, No. 131, Dec. 10, 2002, p. 22, XP002306011.

Submicron CMOS Gate Array, IBM Technical Disclosure Bulletin, IBM Corp, New York US, vol. 33, No. 3B, Aug. 1990, pp. 129-131, XP000124293.

EPO, Supplementary European Search Report, mailed Apr. 10, 2007, related to Application No. EP04753540.6-2224.

International Search Report for PCT/US04/16723, mailed Sep. 15, 2005.

Notice of Allowance mailed Mar. 23, 2010 for U.S. Appl. No. 10/447,465.

Office Action mailed Sep. 29, 2009 for U.S. Appl. No. 10/447,465.

Final Office Action mailed Dec. 16, 2005 for U.S. Appl.No. 10/447,465.

Office Action mailed May 17, 2005 for U.S. Appl. No. 10/447,465.

Office Action issued Apr. 22, 2011 from JP Patent Application No. 2006-533453.

* cited by examiner

Fig. 2
Prior Art

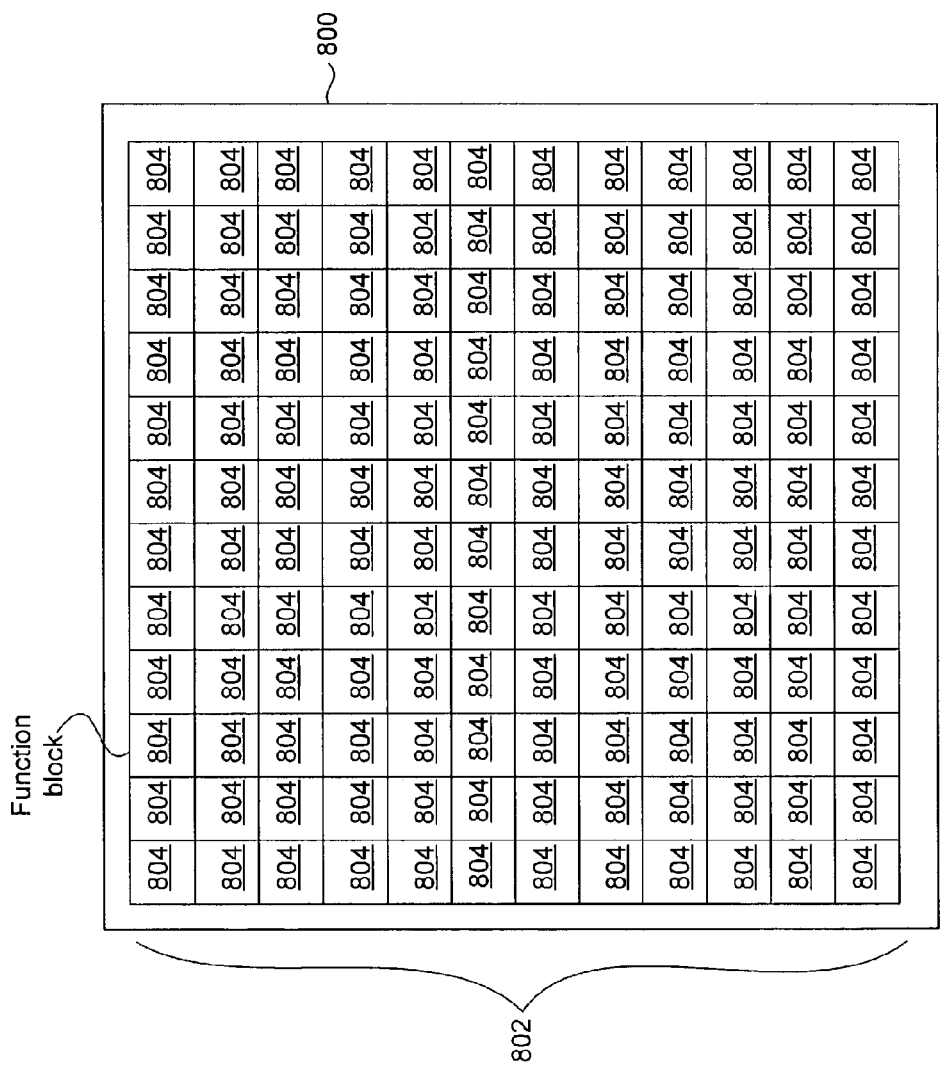

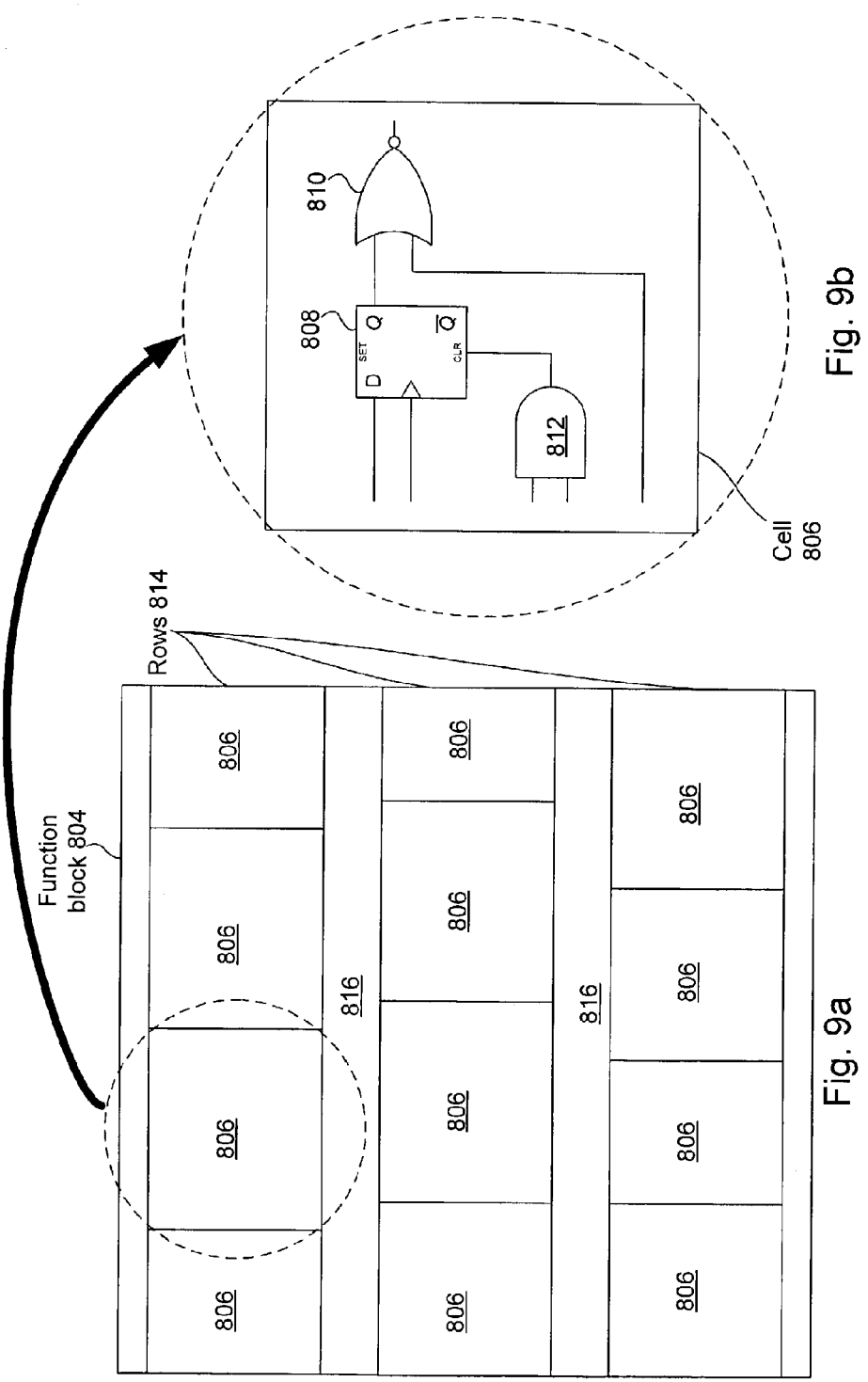

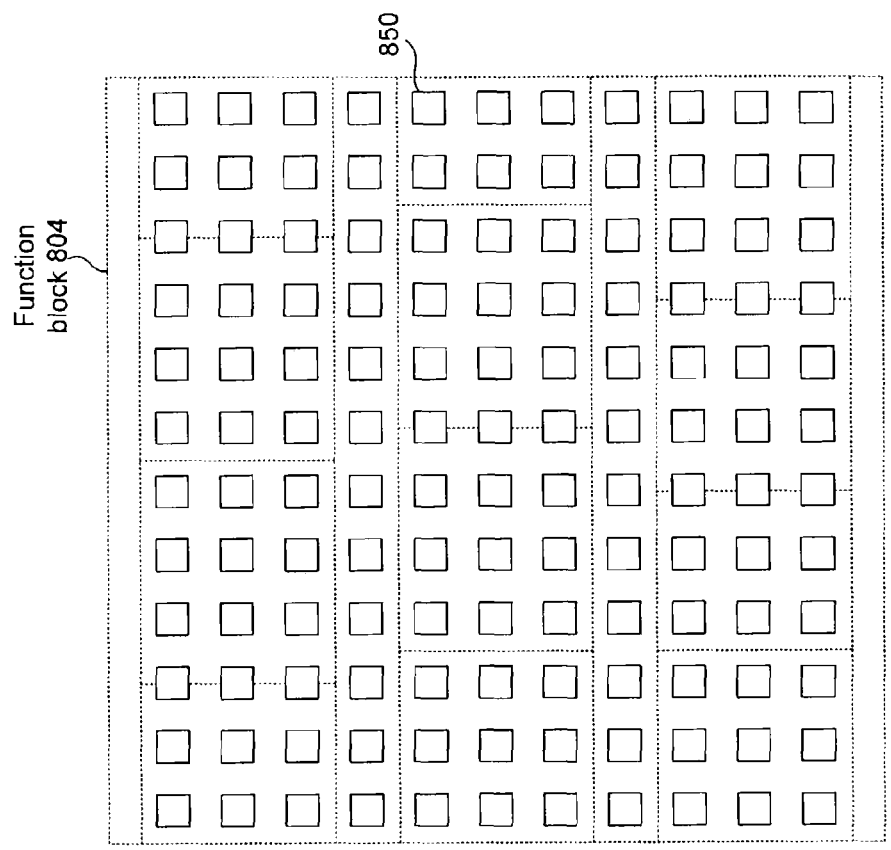

MODULAR ARRAY DEFINED BY STANDARD CELL LOGIC

The present application is a divisional application of U.S. patent application Ser. No. 10/447,465, filed May 28, 2003, entitled "MODULAR ARRAY DEFINED BY STANDARD CELL LOGIC," now issued as U.S. Pat. No. 7,770,144, which is hereby incorporated by reference in their entireties for all purposes except for those sections, if any, that are inconsistent with the specification.

BACKGROUND

Use of ASICs (application specific integrated circuits) has become widespread in the semiconductor industry as giving circuit design engineers a relatively high amount of functionality in a relatively small package. In particular, ASICs are customizable integrated circuits that are customized to implement a circuit specified by a design engineer (a "custom circuit design"). The term "ASIC" actually refers to a variety of integrated circuit (IC) styles that vary in degree of customizability, including standard cells, gate arrays, and FPGAs. As a general rule, the more customization that is required, the more expensive the ASIC will be and the longer the ASIC will take to fabricate.

In forming ASICs generally, several layers will be required. FIG. 1 shows a partial cross-sectional view of a generic integrated circuit. First, active layers 110 are formed on a semiconductor substrate. The active layers 110 include devices such as transistors and diodes. Many active layer devices are formed independently of one another, i.e., they are not connected to form a circuit. Thus, once active layers 110 are formed, conducting layers, which are often composed of a metal such as aluminum or copper, are formed over the active layers to interconnect the devices, thereby forming a circuit. Several conducting layers may be required to completely interconnect the devices to form a useful circuit. Four conducting layers, M1 120, M2 130, M3 140, and M4 150, are shown in FIG. 1. Of course, different types of ICs or ICs fabricated using different processes may require more or less than four metal layers for circuit interconnection.

In between each conducting layer is an insulating layer 115, 125, 135, 145 as shown in FIG. 1. Insulating layers are present to prevent shorts between conducting layers. To interconnect the conducting layers, vias 116 are formed through the insulating layers and are filled with conducting material (e.g., metal).

In forming the structure of FIG. 1, after the active layers 110 are formed, an insulating layer 115 is formed over the active layers 110, for instance, by growth or deposition of insulating material. Next, a masking step is utilized to form vias in the insulating layer, as is generally known in the art. Such masking often entails depositing a photoresist layer and patterning the layer using ultra-violet light, enabling removal of only selected portions of the photoresist, and then etching the insulating layer in accordance with the photoresist pattern. After forming the vias, a conducting layer is deposited and then patterned using a similar masking process, so that metal (or other conductor) remains only in desired locations. The process is repeated for each insulating layer and conducting layer required to be formed.

Thus each conducting layer required to be formed generally demands at least two masking steps: one step to form vias through the insulating layer to connect to the layer below and one step to form connection wires or lines. Unfortunately, each mask step required generally entails significant time and expense.

At the active layer level, ASIC active devices are generally arranged to form function blocks, also commonly referred to as "cells" or "modules." To interconnect the devices, "horizontal" and "vertical" connection lines are formed in the conducting layers. As is well understood in the art, any two points can be connected using horizontal and vertical connection lines (that is, connection lines that are orthogonal with respect to one another). While such interconnections can be done in one metal layer, more typically, horizontal connections are formed in a first metal layer and vertical connections are formed in a second metal layer with an insulating layer having vias formed between to connect the two layers.

Of great importance to an IC designer in implementing circuit designs with an ASIC is the functionality available from the ASIC. That is, the IC designer may have circuit designs which include a large number of different combinational functions (e.g., Boolean logic), sequential functions (e.g., flip-flops, latches), and/or memory functions (e.g., SRAM), and the designer would prefer an ASIC that efficiently implements a significant majority of his or her design so that the overall design is implemented in the smallest space possible. Since ASICs are generally formed of function blocks, the functionality available in each of these devices will be primarily determined by the architecture within each function block.

Also important to an IC designer is customization time. Particularly during the design stages, the IC designer wants to obtain a model, or prototype, of his or her designs quickly so that the designs can be tested and used with other circuitry.

One approach to ASICs is the gate array. In gate arrays, function blocks 210 are generally arranged to form a regular array 200, shown in FIG. 2. Such function blocks are generically designed and include a particular number, size, arrangement, and type of semiconductor devices, e.g., transistors. An example gate array function block 210 is shown in FIG. 3, having six transistors of varying size and drive capability. Such an array, prior to implementing a custom circuit design, is sometimes referred to as a "base array." Prior to array customization, the base array transistors are primarily free-standing, having few, if any, internal connections to one another. Accordingly, the base array of such a gate array is sometimes referred to as a "sea of gates."

To customize the sea-of-gates gate array to implement a particular custom circuit design, various connections are made among the active devices within the function block (local interconnections) and connections are made among function blocks (global interconnections). In other words, routing is customized. There are generally at least three to five layers of connecting wires formed over the active device layer, and each layer requires at least two masking steps to form (one step to form vias to the layer below and one step to form connecting wires). Thus, at least six to ten masking steps must be undertaken to fully customize a sea-of-gates type gate array. So although the sea-of-gates gate array allows for circuit flexibility by allowing for implementation of combinational and sequential functions, as well as memory functions, such a gate array will bear the costs of multiple masking steps for routing. In addition, because of the multiple masking steps required, production time for customizing the gate array can be considerable. Still, because the base array is generic, capable of implementing a wide variety of custom circuit designs, wafers can be prefabricated through the base array and stockpiled until a custom circuit design is received, thereby minimizing the mask steps required for customization and speeding production of a customized circuit.

A second approach to gate arrays, and one having a more rapid customization time, is the field programmable gate array (FPGA). The FPGA is prefabricated through all layers (active layers, metal layers, and insulating layers). FPGAs are also arranged into a regular array of function blocks as shown in FIG. 2. The FPGA function blocks are often composed of a fixed logic circuit of multiplexers and other logic gates. A sample FPGA function block 210' is illustrated in FIG. 4. Each function block 210' can perform a wide variety of logical functions. The function to be performed by the fixed logic circuit is selected by determining the input signals to the function block. Thus, to customize an FPGA, an IC designer can specify signals (including power and ground) to be coupled to the inputs and outputs for each function block thereby determining the logical function the function block is to perform.

FPGA customization time tends to be more rapid than other types of gate arrays because the active device layer and all insulating and conducting layers are fixed. In other words, both the local interconnect structure and the global interconnect structure are fixed. The global interconnect structure is formed of a plurality of intersecting wires. At each intersection is either a fuse or a programmable RAM bit. Thus, to program function-block functionality (i.e., to control input signals to each function block), either a fuse is stressed to melt and form a connection at the intersection, or a RAM bit is programmed to form this connection. Since the entire FPGA structure is fixed by the manufacturer, no additional mask steps are required and FPGA programming can actually be done by the IC designer with equipment and software at his or her own place of business. Commonly, an IC designer will specify a logical function (often from a library) that the designer wishes the function block to perform and the signals to be coupled to function block inputs and outputs are then determined and programmed by software.

Despite rapid and easy customization, FPGAs currently available have drawbacks. FPGAs are often used in intermediate design steps for test purposes, but cannot often be used in a final product: because of the nature of the FPGA interconnect structure, an FPGA often will not meet the performance expectations of the final product (e.g., timing) and thus has only limited use in test situations.

At the other end of the spectrum from FPGAs are standard cell-type ASICs. A standard cell 300 is generally illustrated in FIG. 5. As shown, a typical standard cell includes several horizontal rows 302 of function blocks 304, sometimes referred to as "cells," where the function blocks have the same height, but unequal width. Although each cell has a pre-defined number of devices, the cells are individualized for use in a particular custom circuit design by optimizing device size and placement as well as eliminating extraneous pre-defined devices. Therefore, the cells are not all identical and prefabrication (fabrication prior to receiving a custom circuit design) is not possible.

To simplify the design process, various vendors have developed standard cell libraries. Each library includes many components (sometimes also referred to as "books" or "macros"), each component defining a logical function that can be formed using one or more cells. An example library component 402 is shown in FIG. 6 as a D-type flip-flop 404 and buffer 406. Literally thousands of pre-designed components are available in libraries for selection by the IC designer. Use of the standard cell libraries is advantageous in that designers save time, money, and reduce risk by using pre-designed and pretested logic. Unlike gate arrays which have fixed device size, each cell can further be optimized individually in that every transistor can be chosen, for example, to maximize speed, minimize area, or provide proper drive strength. Further, unlike gate arrays, the spacing (the channels) between rows in a standard-cell type ASIC can be adjusted. The designer then defines the placement of the cells and the interconnect routing. Therefore, standard cells provide similar performance and flexibility advantages of a full-custom ASIC but at reduced design time and risk.

Although the use of libraries aids in the automation of the process of assembling the ASIC, all of the masks used to form a standard-cell type ASIC are customized since no part of the circuit structure is completely known prior to receiving a custom circuit design. Accordingly, standard cells require fabrication of all layers including active layers, conducting layers, and insulating layers. So while standard-cell type ASICs offer considerable design flexibility, they are expensive and require considerable time to fabricate. Therefore, they tend to be used after initial designs are completed and tested with FPGAs or other partially pre-fabricated gate arrays, such as sea-of-gates-type gate arrays.

As IC designers create more and more complex IC designs, they are demanding more functional capabilities from ASICs while further demanding that customization time remain low, that ASIC die size remain small, and that reliability remain high. So, although available ASICs allow some flexibility to the IC designer, improved architectures are always desirable. Particularly desirable is any architectural design that allows increased flexibility and functionality while reducing customization time.

SUMMARY

A device in accordance with an embodiment of the invention includes a plurality of function blocks fixedly defined prior to receipt of a custom circuit design. The logic within each function block is defined by at least one component from a pre-existing library of standard cell logic. Since it is pre-defined, such a device can be prefabricated for use later when a custom circuit design is received.

In some embodiments, the function blocks are arranged to form a base array of identical function blocks. Within each function block are a plurality of primitive cells. Each respective primitive cell includes respective logic defined by a respective component from a pre-existing standard cell library. In some embodiments, the primitive cells are arranged in the function block according to a predicted relationship among the primitive cells when they are interconnected to form a customized circuit. In some embodiments the primitive cells are arranged in rows in the function block.

To customize the base array, additional interconnection layers (conducting and insulating layers) are formed, thereby forming local interconnections within the function blocks amongst the primitive cells and forming global interconnections amongst the function blocks.

Because the base array can be prefabricated, customization time is rapid. In addition, because of a simplified design process for the base array, integrated circuits that include an embodiment of the invention may be less expensive than similar devices that do not include an embodiment of the invention.

BRIEF DESCRIPTION OF THE DRAWINGS

The present invention is described with respect to particular exemplary embodiments thereof and reference is accordingly made to the drawings, which are not necessarily drawn in scale, and in which:

FIG. 2 is a block diagram of an integrated circuit having an array of function blocks;

FIG. 8 is a block diagram of an array of function blocks in accordance with an embodiment of the invention;

FIG. 9a is an exemplary block diagram of a function block having a plurality of primitive cells in accordance with an embodiment of the invention;

FIG. 9b is an exemplary block diagram of logic that might appear in a primitive cell defined by a standard cell library component in accordance with an embodiment of the invention; and FIG. 10 illustrates a regular pin grid in accordance with an embodiment of the invention.

DETAILED DESCRIPTION

Figure 1:
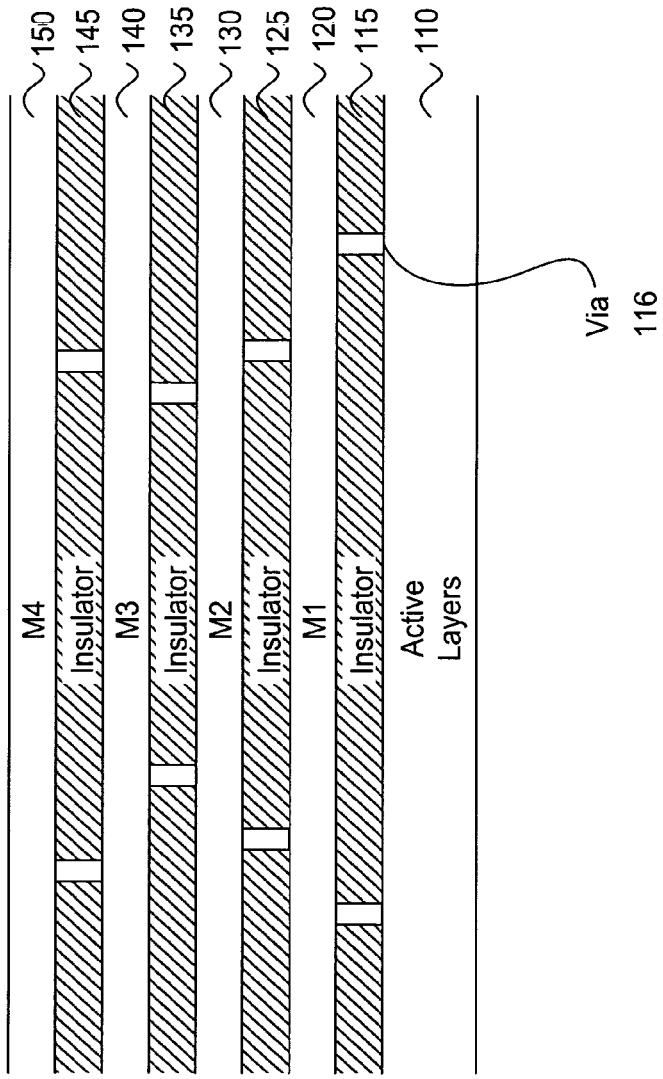
FIG. 1 is a partial cross-sectional view of a generic integrated circuit.
Figure 2:
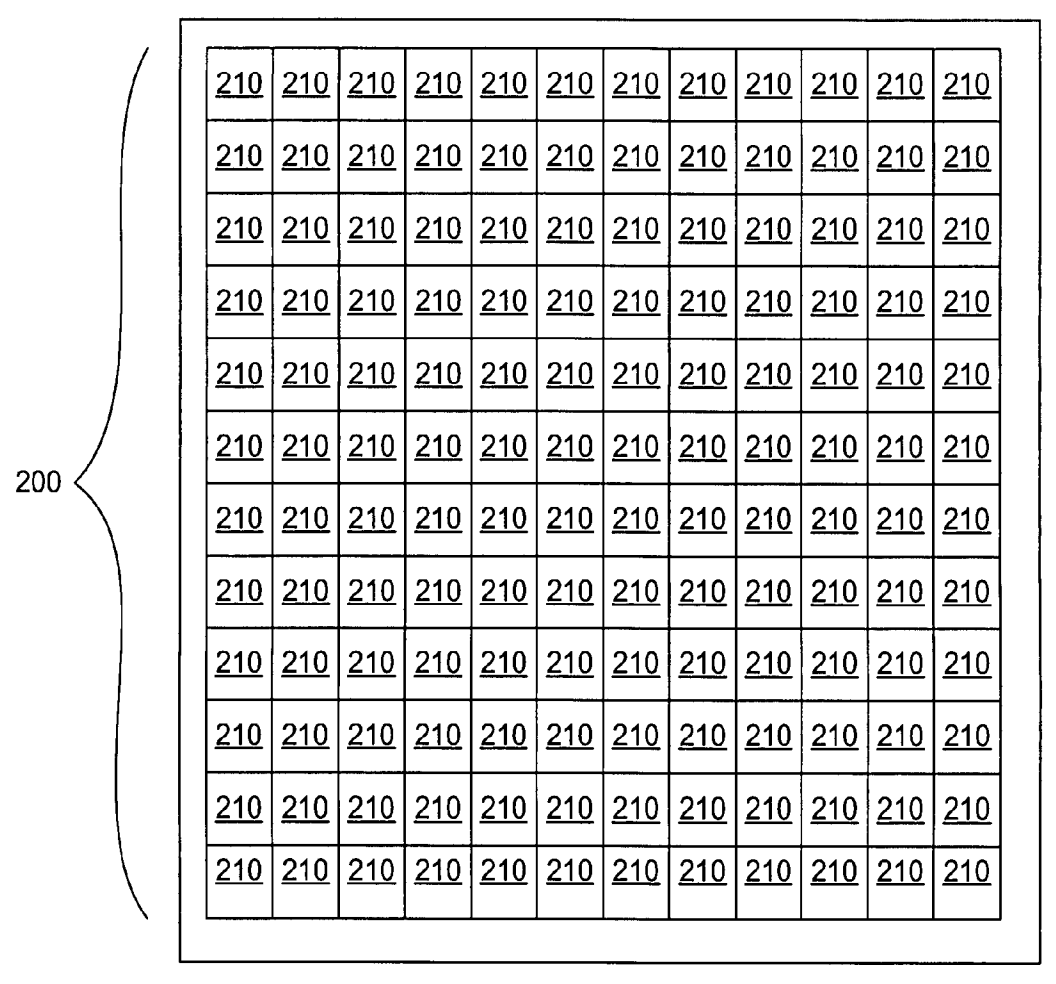
Figure 3:
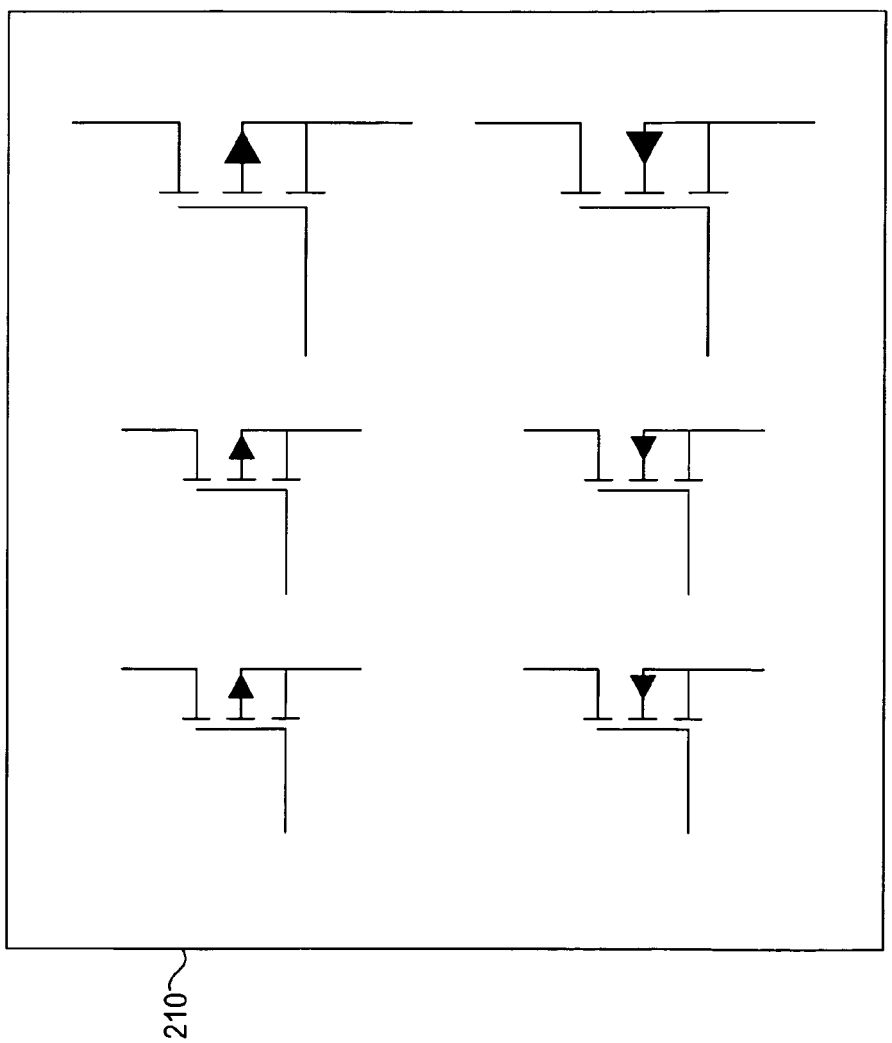
FIG. 3 is a logical block diagram of an exemplary function block for a gate array.
Figure 4:
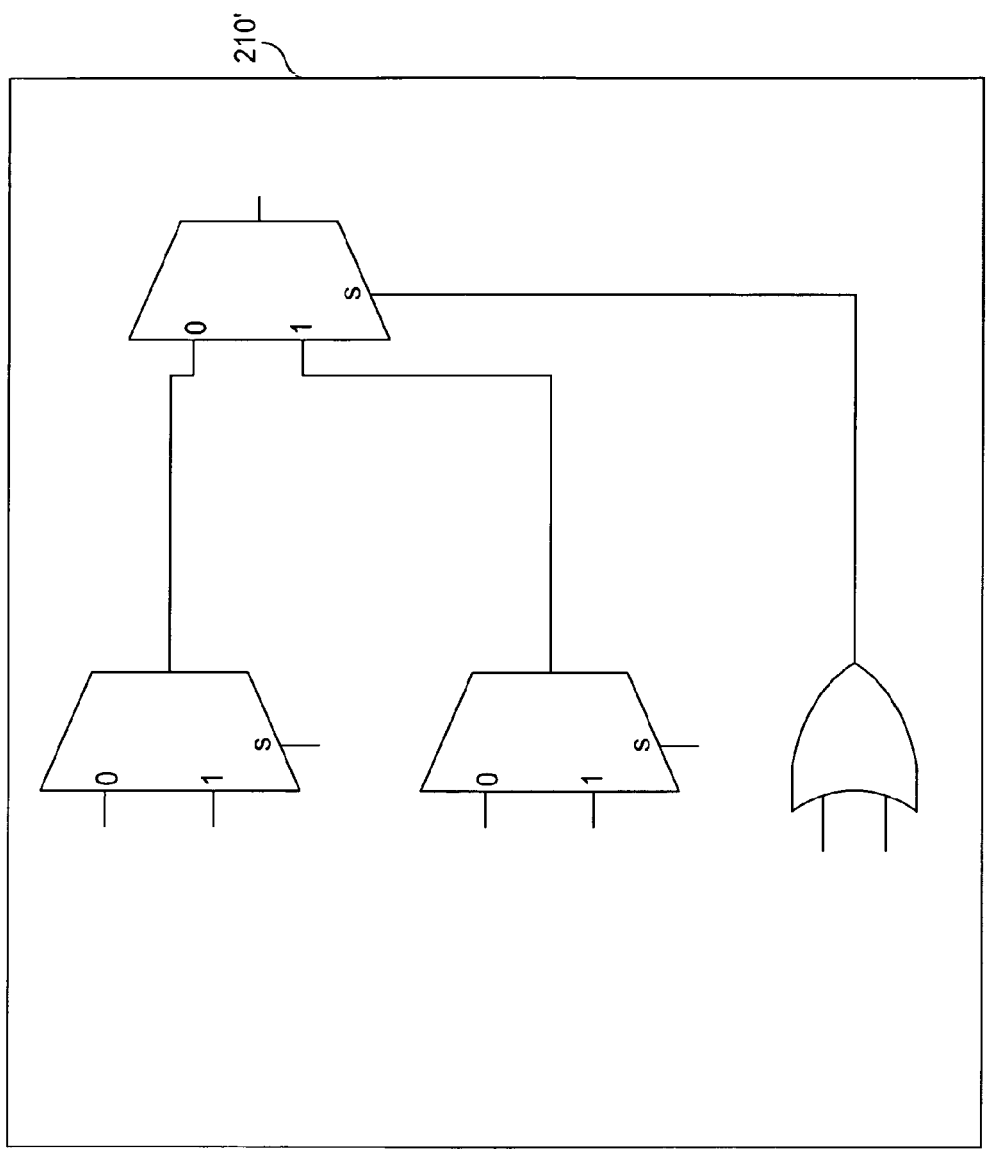
FIG. 4 is a logical block diagram of an exemplary function block for an FPGA.
Figure 5:
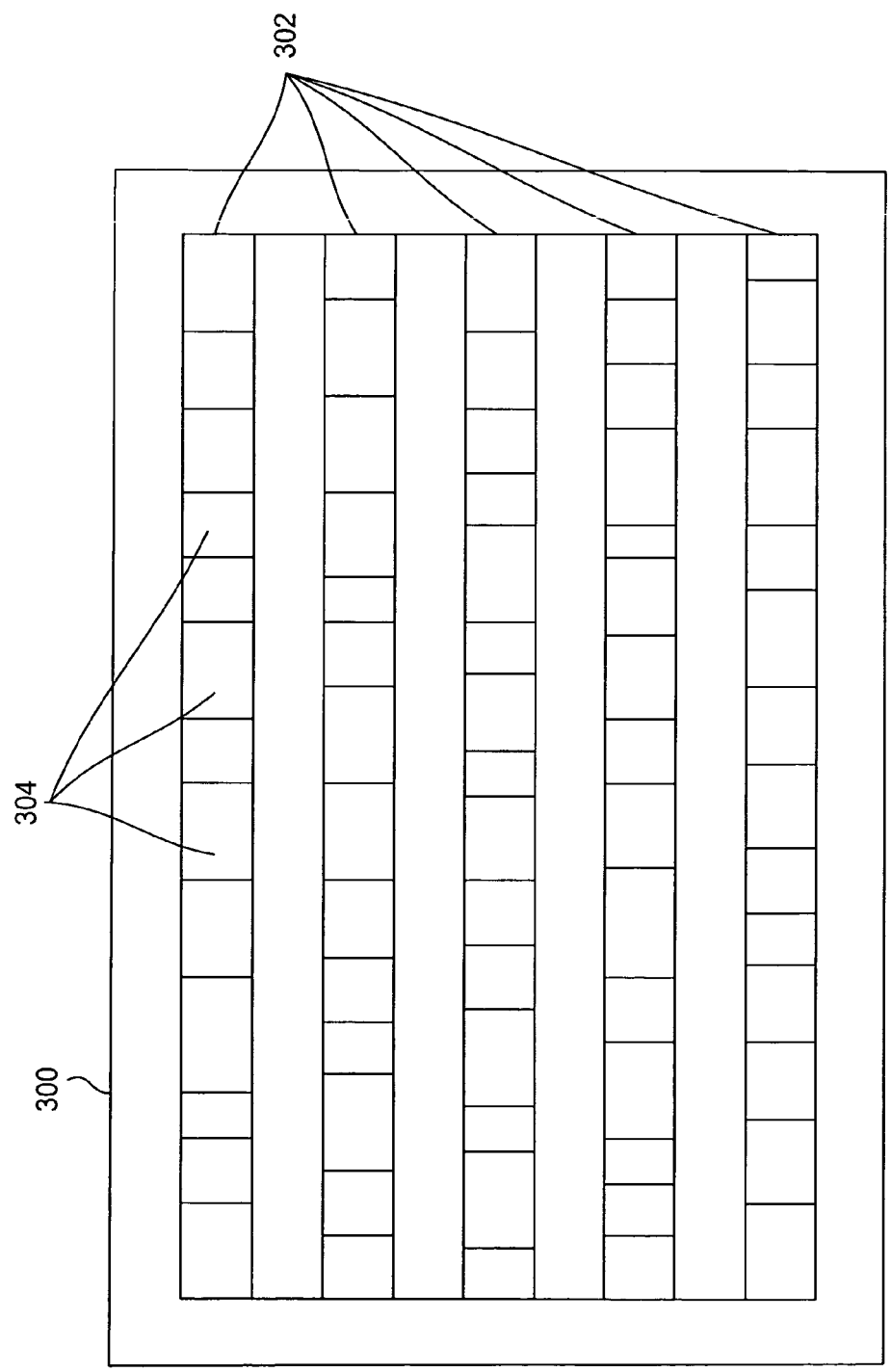
FIG. 5 is an exemplary block diagram of the function blocks for a standard cell.
Figure 6:
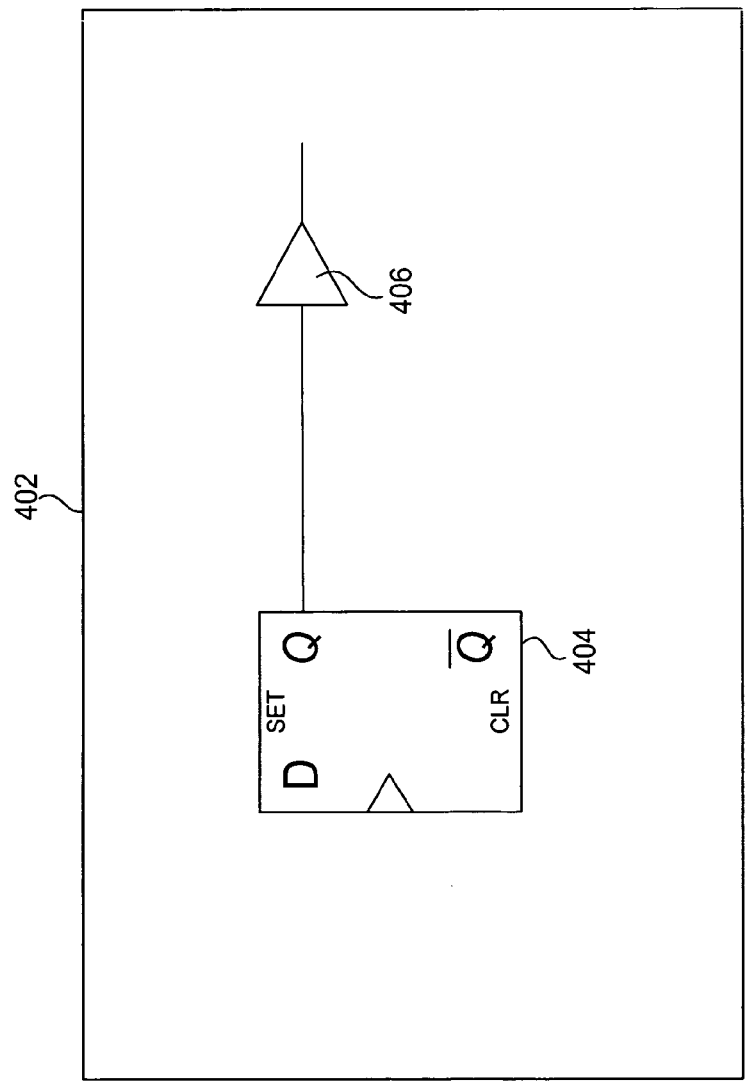
FIG. 6 is an exemplary function block (or "cell") for a standard cell.
Figure 7:
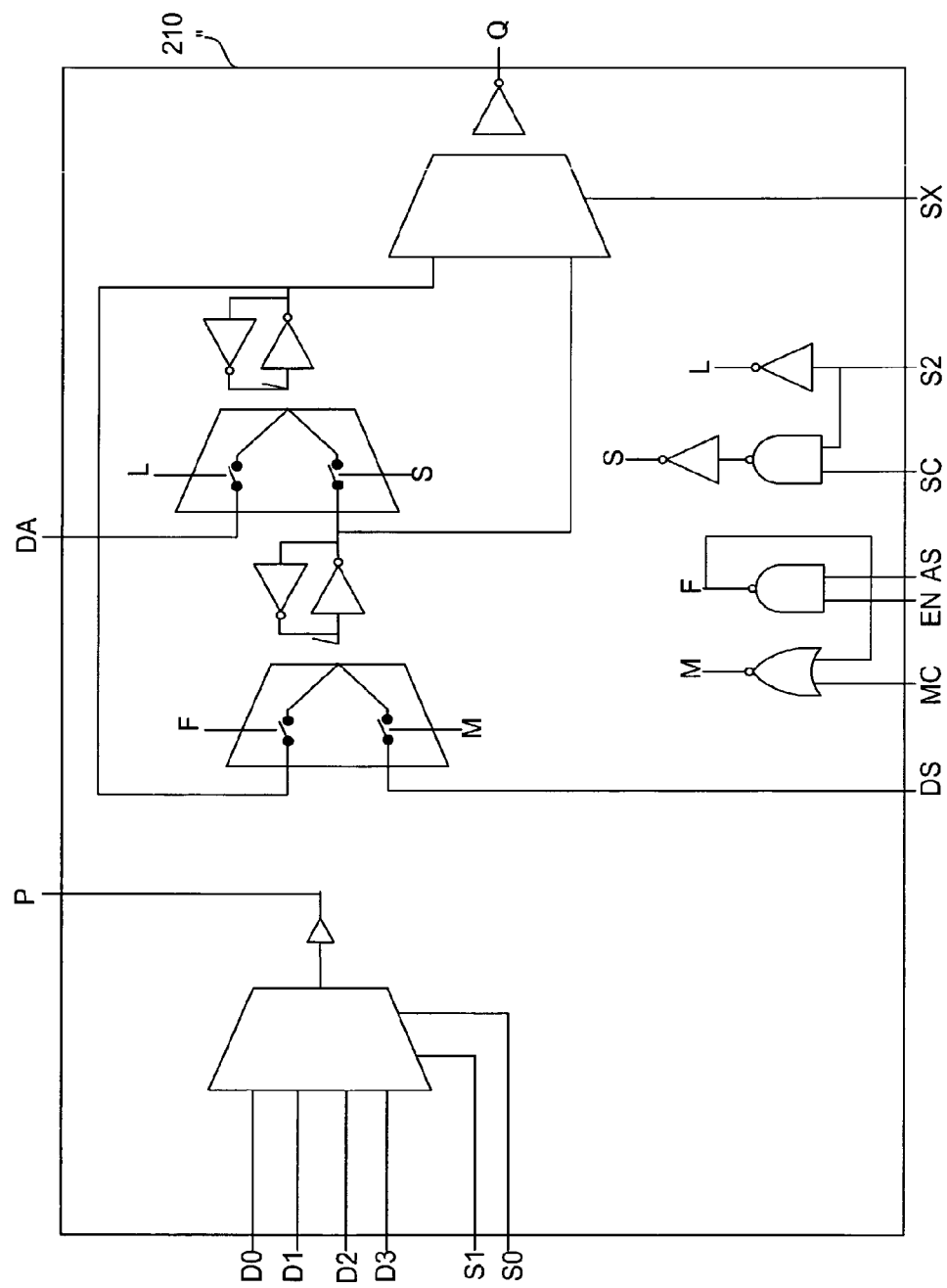
FIG. 7 is an exemplary function block for a module based array.

One solution to creating more rapid turnaround time for ASICs is to use a module based array, or "MBA." Such an MBA is composed of a base array of identical function blocks, such as shown in FIG. 2. However, as opposed to a sea-of-gates type gate array, where only the active device layer is pre-defined, in an MBA the active layers and some of the interconnect layers for each function block are pre-defined, typically those layers forming part of the local interconnections. Therefore, as pre-defined, each function block includes a number of locally interconnected active devices, which are designed to form circuitry such as multiplexers, boolean logic, and latches. The logic is generally designed so that many useful logical functions can be formed merely by varying the input signals to the function block, as with an FPGA. For instance, to change the functionality of each block to accommodate a custom circuit design, one specifies whether the function block inputs are to be coupled to power, ground, the output of another function block, or an I/O pad. Therefore, the turnaround time for an MBA is faster than that for a sea-of-gates type gate array, while still allowing considerable flexibility and functionality, since the MBA device can be prefabricated through several layers and stockpiled by the vendor. An example of circuitry used in an MBA function block 210" is shown in FIG. 7, which is further described in U.S. Pat. No. 6,014,038, entitled "Function Block Architecture for Gate Array."

Nonetheless, designing a useful generic function block for use in an MBA is a time-consuming and costly undertaking. Therefore, an embodiment in accordance with the present invention creates an MBA that uses one or more pre-existing components from standard cell libraries to form function block logic. As a result, significant cost savings can be made by the vendor, which in turn could be passed to the end user.

Referring to FIGS. 8 and 9, an embodiment of an integrated circuit 800 in accordance with the invention includes a base array 802 of pre-defined function blocks 804. In some embodiments, the circuitry of all function blocks 804 is identical.

As used herein, "pre-defined function blocks" refers to function blocks that have fixedly defined circuitry prior to receipt by the ASIC designer of a custom circuit design for implementation. By "fixedly defined" is meant that the circuitry is not changeable—e.g., it cannot be optimized—or take into account specifics of a particular custom circuit design. Although various embodiments of the invention are described herein as an "array," it is to be understood that other embodiments may include function blocks that are pre-defined but not arranged in an array.

Each function block 804 includes one or more primitive cells 806 (FIG. 9a). The circuitry for each primitive cell 806 is defined by a respective standard cell library component. For instance, as shown in FIG. 9b, one primitive cell 806 may be defined by a library component that includes a flip-flop 808 having its Q output coupled to one input of NOR gate 810, and an AND gate 812 having its output coupled to the CLR input of flip-flop 808. The functionality shown in FIG. 9b would have been selected by the MBA designer from a pre-existing standard cell library produced by a vendor such as Artisan Components, Inc. By "pre-existing" library is meant that the library existed prior to the design of the function blocks 804. Each primitive cell in one embodiment will be defined by a different respective library component so that each primitive cell in the function block contains unique logic with respect to the other primitive cells 806 in the function block. Still other embodiments, while having unique logic in many primitive cells, will have some primitive cells 806 with the same or similar logic as other primitive cells within a particular function block 804. In some embodiments, a function block could even be formed from only a single primitive cell 806.

The standard cell library used to define the primitive cells 806 is selected to be compatible with the fabrication process to be used to form the integrated circuit. For instance, the components defined in Artisan Components, Inc.'s library are compatible with processes used by TSMC, a foundry used by some IC designers. In some embodiments, more than one standard-cell library could be used to define the primitive cell as long as each library is process-compatible.

In order to form a useful base array, a set of components is selected from a standard cell library based on the components' ability to form useful functions or drive strengths. Some or all of these components are then selected for use as primitive cells in the function block. The primitive cells are arranged in one or more rows 814. In addition, the primitive cells are placed with respect to one another based on predicted relationships as to how the primitive cells will be used together in a custom circuit. For instance, the primitive cells are arranged in some embodiments so that drive strengths are most usefully positioned.

In some embodiments, the channels 816 between the rows can be made larger, smaller, or removed altogether. Embodiments that retain channels 816 will find them useful for local routing amongst the primitive cells.

Once the primitive cell logic has been defined and the primitive cell arrangement within the function block has been defined, the base array can be prefabricated—fabricated prior to receiving a custom circuit design—from the active layers through several conducting layers. The prefabricated conducting layers will form interconnections within the primitive cells 806, but will not form the entire local interconnect structure. In other words, the primitive cells are not interconnected in the pre-defined/prefabricated state in one embodiment. Once prefabricated, the wafers containing one or more base arrays can be stockpiled by the vendor until ready to use. Once a custom circuit design is received, the local interconnect in the function block can be completed as well as the global interconnect to form a customized integrated circuit.

Some embodiments will only prefabricate the base array, stockpiling such wafers until a custom circuit design is received. Other embodiments, however, will also form a predefined generic routing structure in interconnection layers over the base array. This routing structure can later be used to form the local and global interconnections used to form the custom circuit. An example of such a routing structure can be found in U.S. Pat. No. 6,242,767, entitled "ASIC Routing Architecture." While either method reduces the number of masks required to customize (or personalize) the IC over that required by gate arrays and standard cells, a pre-defined and prefabricated generic routing structure can further reduce the masks required for customization. In some embodiments, using a pre-defined routing structure will require only one or two additional mask steps for customization.

In still other embodiments, a base array will be prefabricated as previously described (i.e., with insulating and conducting layers forming interconnections within primitive cells 806). As will be understood, such a base array will result in an irregular pin layout (where "pins" are the inputs and outputs of the primitive cells or function blocks). Therefore, in some embodiments, some routing is performed for the prefabricated device to form a regular pin grid. Such routing will include an insulating layer forming vias to the inputs and outputs of the primitive cells and a conducting layer routing the inputs and outputs into a regular grid. Some embodiments will further include another insulating layer forming vias to the conducting layer resulting in the pin grid structure of FIG. 10. In such an embodiment, custom routing will start over the FIG. 10 structure. In FIG. 10, function block 804 is shown in phantom and vias 850 (pins) to inputs and outputs of function block 804 are shown over function block 804, but intermediate insulating and conducting layers are omitted for clarity of illustration.

Further, as discussed previously, some primitive cells will be arranged based on a predicted relationship with one another. For instance, if statistically the output of one primitive is likely to be connected to the input of a second primitive cell, e.g., to form a commonly used macrocell, it may conserve routing resources to place those primitive cells adjacent one another. However, taking this concept a step further, in some embodiments where the I/O pins are routed to form a regular grid, pins that are statistically likely to be used together can be placed in proximity to one another, e.g., the output pin of the first primitive can be placed adjacent the input pin of the second primitive. Selectively placing the pins according to such a predicted relationship will serve to further conserve routing resources.

Accordingly, an embodiment of the invention has been disclosed that minimizes the IC design and layout work required to produce an MBA. In addition, due to the MBA structure, many of the connections used to form a customized circuit are localized, minimizing delays and route congestion. Finally, a device in accordance with an embodiment of the invention is an inherently flexible ASIC that can be customized relatively quickly, sometimes even in one day.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A method comprising:

forming, on a wafer, at least one interconnect layer and a plurality of function blocks, wherein each function block includes a plurality of primitive cells, wherein each of the primitive cells comprises logic including a plurality of devices, wherein the at least one interconnect layer, circuitry of at least one of the function blocks, and circuitry of at least one of the primitive cells are fixedly defined by at least one component from a pre-existing library of standard cell logic, and wherein said forming is performed prior to receipt of a custom circuit design to be implemented using the plurality of function blocks, the plurality of primitive cells, and the at least one interconnect layer to thereby permit prefabrication of the plurality of function blocks; and interconnecting, prior to receipt of the custom circuit design, at least some of the plurality of primitive cells to each other by at least one interconnect in the at least one interconnect layer, and leaving disconnected, prior to receipt of the custom circuit design, the plurality of function blocks from each other.

2. The method of claim 1, further comprising determining, prior to receipt of the custom circuit design, placement of the plurality of function blocks based, at least in part, on a predicted relationship among the plurality of function blocks.

3. The method of claim 2, further comprising arranging, prior to receipt of the custom circuit design, the plurality of function blocks and the plurality of primitive cells according to the respective predicted relationships.

4. The method of claim 3, wherein said arranging comprises arranging the plurality of function blocks in an array.

5. The method of claim 3, wherein respective logic of each of the plurality of function blocks is identical.

6. The method of claim 3, wherein said arranging comprises arranging the plurality of primitive cells in rows in respective ones of the plurality of function blocks.

7. The method of claim 3, wherein said arranging comprises arranging a plurality of pins to form a plurality of inputs and outputs for each of the plurality of function blocks.

8. The method of claim 7, wherein said arranging comprises arranging the plurality of inputs and outputs to form a regular grid.

9. The method of claim 1, wherein said forming comprises defining the circuitry for the primitive cells such that logic for each of the plurality of primitive cells for a particular function block is unique with respect to logic for other ones of the plurality of primitive cells for the particular function block.

10. The method of claim 1, wherein said forming comprises arranging a plurality of pins according to a predicted relationship among the plurality of function blocks.

11. The method of claim 10, wherein said arranging comprises routing the plurality of pins into a regular grid according to the predicted relationship.

12. The method of claim 10, wherein said arranging comprises placing the plurality of pins according to the predicted relationship.

* * * * *